United States Patent
Dimitrijevic et al.

(10) Patent No.: US 9,496,487 B2
(45) Date of Patent: Nov. 15, 2016

(54) VERTICAL HALL DEVICE

(71) Applicant: Senis AG, Zug (CH)

(72) Inventors: Sasa Dimitrijevic, Mramor (RS); Radivoje Popovic, Zug (CH)

(73) Assignee: Senis AG, Zug (CH)

( * ) Notice: Subject to any disclaimer, the term of this patent is extended or adjusted under 35 U.S.C. 154(b) by 0 days.

(21) Appl. No.: 14/794,439

(22) Filed: Jul. 8, 2015

(65) Prior Publication Data

US 2016/0013399 A1  Jan. 14, 2016

(30) Foreign Application Priority Data

Jul. 11, 2014 (EP) ..................................... 14176835

(51) Int. Cl.
*H01L 43/06* (2006.01)
*G01R 33/07* (2006.01)

(52) U.S. Cl.
CPC ........... *H01L 43/065* (2013.01); *G01R 33/077* (2013.01)

(58) Field of Classification Search
CPC ........................... H01L 43/065; G01R 33/077
See application file for complete search history.

(56) References Cited

U.S. PATENT DOCUMENTS

| | | | |
|---|---|---|---|
| 4,782,375 A | 11/1988 | Popovic | |
| 4,829,352 A | 5/1989 | Popovic et al. | |
| 5,057,890 A | 10/1991 | Falk et al. | |
| 7,872,322 B2 | 1/2011 | Schott et al. | |
| 8,829,900 B2 * | 9/2014 | Ausserlechner | ...... H01L 43/065 324/207.2 |
| 2006/0011999 A1 | 1/2006 | Schott et al. | |
| 2010/0164483 A1 | 7/2010 | Namai et al. | |
| 2010/0219810 A1 | 9/2010 | Rocznik et al. | |
| 2013/0021026 A1 | 1/2013 | Ausserlechner | |

FOREIGN PATENT DOCUMENTS

JP   2006-128400 A   5/2006

OTHER PUBLICATIONS

Burger, F et al., "New fully integrated 3-D silicon Hall sensor for precise angular-position measurements," Sensors and Actuators A: Physical, vol. 67, Issues 1-3, May 1998, pp. 72-76.

* cited by examiner

*Primary Examiner* — William Coleman
(74) *Attorney, Agent, or Firm* — Nixon Peabody LLP (57) ABSTRACT

A vertical Hall device has a deep N-well, two inner contacts, two outer contacts and, optionally, a central contact disposed at a surface of the deep N-well and arranged along a straight symmetry line. The vertical Hall device is designed according to the invention to have an effective width of the outer contacts that is bigger than an effective width of the inner contacts. A shallow highly doped $P^+$ stripe may be disposed between the inner contacts or between each of the inner contacts and the central contact. These measures help to balance the resistances of the Wheatstone bridge which describes the electrical characteristics of the vertical Hall device.

8 Claims, 5 Drawing Sheets

VERTICAL HALL DEVICE

PRIORITY CLAIM

Applicant hereby claims foreign priority under 35 U.S.C §119 from European Patent Application No. 14176835.8 filed Jul. 11, 2014, the disclosure of which is herein incorporated by reference.

FIELD OF THE INVENTION

The invention relates to a vertical Hall device fabricated by an IC (integrated circuits) technology of integrated circuits, for example a CMOS technology.

BACKGROUND OF THE INVENTION

A Hall-effect device, or Hall device in short, also known as a Hall element or Hall sensor, is a device that converts the component to be measured of a magnetic field vector into a voltage. Hall devices are currently the most used magnetic sensors. They are commercially available both as discrete devices and integrated circuits incorporating a combination of a Hall device, current source, amplifier, and other signal conditioning electronic circuits. The principle of operation and basic technology of Hall devices are described in the book by R. S. Popovic, entitled "HALL EFFECT DEVICES", Institute of Physics Publishing, Bristol and Philadelphia 2004.

Briefly, there are two classes of Hall devices, which are known as horizontal Hall devices and vertical Hall devices. A horizontal Hall device has the form of a plate, which is usually disposed in parallel with the active chip surface, and is sensitive to a magnetic field running perpendicular to the active chip surface. A vertical Hall device usually does not have a plate-like geometry, but it behaves like a plate disposed vertically with respect to the active chip surface, and it is sensitive to a magnetic field running parallel to the active chip surface.

Figure 1:
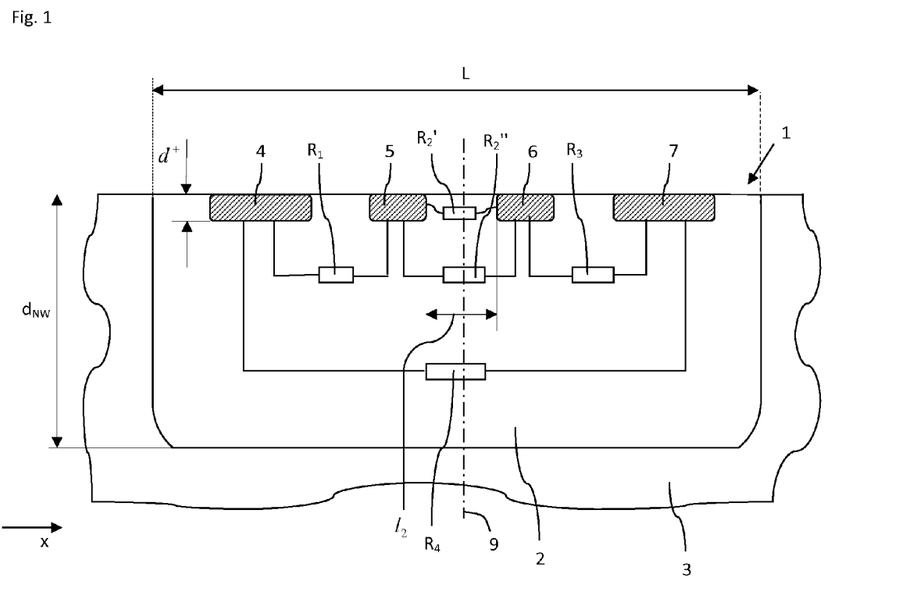
FIG. 1 shows a cross-section of a four-contact vertical Hall device according to the prior art.
Figure 2:
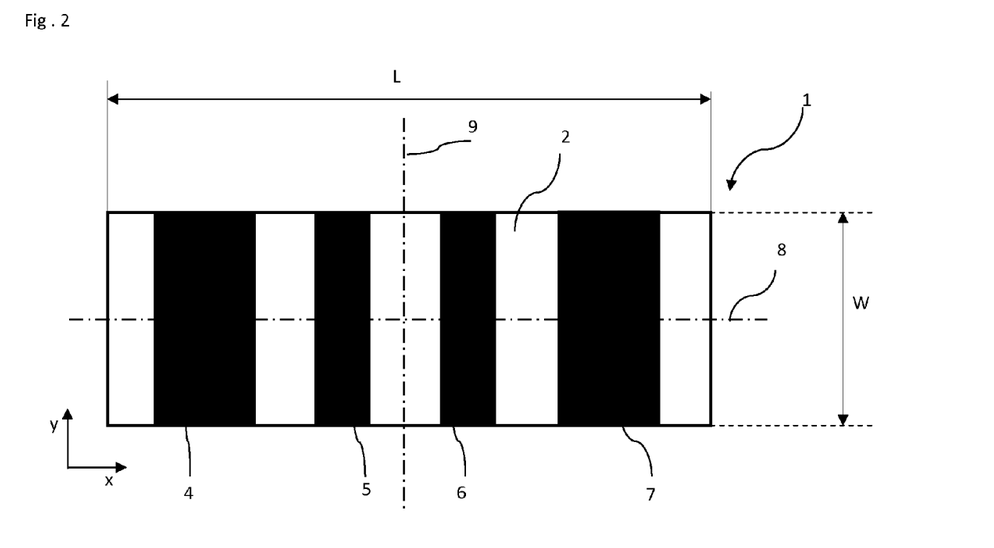
FIG. 2 shows a plan view of the four-contact vertical Hall device according to the prior art.

FIG. 1 shows a cross-section and FIG. 2 shows a plan view of a vertical Hall device 1 of the prior art. In order to avoid confusion, the following convention is used. In all figures showing a plan view of the vertical Hall device, axes x and y oriented orthogonally to each other are used to indicate the direction in which a "length" or a "width" is measured. Any distance along the x-axis, such as L in FIG. 2, will be called a length; and any distance along the y-axis, such as W in FIG. 2, will be called a width. This convention will be applied independently of the ratio of the length and the width of the structure under consideration.

Figure 3:
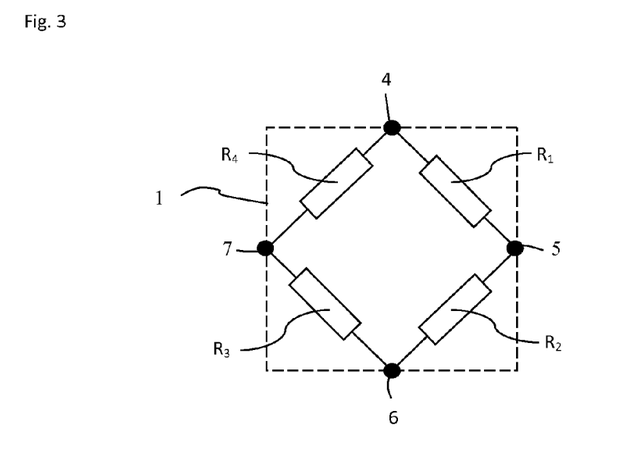
FIG. 3 illustrates the electrical equivalent circuit of a Hall device.

The vertical Hall device 1 is fabricated with an IC (integrated circuit) technology: It has an N-type region 2 which is implanted into a P-type region 3 which may be a P-type substrate. Four heavily doped N$^+$ regions arranged along a straight line 8 are disposed at the surface of the N-well NW and form electrical contacts 4 to 7. The N-well NW has a depth $d_{NW}$, the N$^+$ contacts have a depth $d^+$. The vertical Hall device 1 has a length L and a width W. Two non-neighboring contacts of the vertical Hall device 1 are used as input terminals and the other two non-neighboring contacts are used as output terminals. For example, the contacts 4 and 6 can be used as the input terminals and the contacts 5 and 7 as the output terminals, or vice versa. The electrical resistances $R_1$, $R_2$, $R_3$ and $R_4$ between the contacts 4 to 7 of the Hall device 1 can be represented by a Wheatstone bridge as shown in FIG. 3. As a part of the invention, the resistance $R_2$ is considered to be composed of two resistances $R_2'$ and $R_2''$ with $R_2 = R_2' \| R_2''$.

The Hall device 1 is supplied with a constant current $I_{in}$, or with a constant voltage $V_{in}$ via the input terminals. If the Hall device 1 is exposed to a magnetic field having a component perpendicular to the effective device plane, then the electromotive force of the Hall effect acts between the output terminals. The voltage $V_{out}$, which appears between the output terminals, is called the output voltage of the Hall device 1. The output voltage of a Hall device is given by the following expressions:

$$V_{out} = V_{off} + S_I \times I_{in} \times B, \text{ or } V_{out} = V_{off} + S_V \times V_{in} \times B \qquad (1)$$

where $V_{off}$ denotes an offset voltage, $S_I$ denotes the current-related sensitivity, B denotes the component of a magnetic field perpendicular to the effective device plane, and $S_V$ denotes the voltage-related sensitivity.

In order to be suitable for a practical application as a magnetic field sensor, a Hall device should have the following main characteristics:

a) Low offset: For example, in a silicon integrated Hall device, the offset voltage $V_{off}$ should be $V_{off} < 0.01 \times V_{in}$.

b) Convenient common output voltage level: The voltages $V_{out,1}$ and $V_{out,2}$ of the output terminals should be at about the middle of the input voltage $V_{in}$: $V_{out,1} \approx \frac{1}{2} V_{in}$ and $V_{out,2} \approx \frac{1}{2} V_{in}$.

c) Exchangeability of the input and output terminals: The Hall device characteristics, including the absolute value of the offset voltage, the common level of the output voltage, the input and output resistances, and the magnetic sensitivity should stay nearly equal when the contacts 4 and 6 are used as input terminals and the contacts 5 and 7 as output terminals and when the contacts 5 and 7 are used as input terminals and the contacts 4 and 6 as output terminals. The exchangeability of the input and output terminals of a Hall device is the prerequisite for the application of a technique for the reduction of the offset voltage of the Hall device known as the spinning-current technique.

d) High magnetic sensitivity: Trends go to operate modern sensor systems at a low supply voltage; therefore, the most relevant sensitivity figure of merit of a Hall device is usually $S_V$, not $S_I$. For example, for a silicon integrated Hall device, the voltage-related magnetic sensitivity $S_V$ should be $S_V > 0.03$ V/VT (volt per volt and tesla).

e) Low flicker noise (also known as 1/f noise): For example, at a Hall device supply voltage $V_{in}$ of $V_{in} = 1$ V, the corner frequency $f_c$ of the flicker noise (where the 1/f part of the noise spectral density equals the thermal noise) should be $f_c < 10$ kHz.

The requirements a) through c) will be met if the four resistances $R_1$, $R_2$, $R_3$, $R_4$ are all approximately equal. The voltage-related magnetic sensitivity (requirement d) is a complex function of the characteristics of the material used for the Hall device and of its geometry. But roughly speaking, the requirement d) is easier to meet if the resistances $R_1$, $R_2$, $R_3$, $R_4$ have equal values and are "short". Here "short" means that the length of a resistor is not greater than the square root of its cross-sectional area. The flicker noise (requirement e) depends much on the quality of the material used for the Hall device, and on the quality and protection of its surface.

Theoretically, any two-dimensional (planar) horizontal Hall device can be transformed by a mathematical technique known as conformal mapping into a vertical Hall device. But the calculated dimensions of the contacts are nearly impossible to meet in reality.

Therefore, when designing an integrated vertical Hall device, it is a serious challenge to meet simultaneously all the requirements a) to e). In all known designs of the four-contact vertical Hall device, the resistance between the two outer contacts 4 and 7 is much larger than the resistance between the two inner contacts 5 and 6, i.e. $R_4 \gg R_2$, as can be recognized from FIG. 1. This inequality produces an offset voltage as large as half of the input voltage. The big difference between the resistances $R_2$ and $R_4$ is due to various limitations of the actual CMOS technologies, the main two limitations being the following:

(i) A small depth $d_{NW}$ of the N-well NW with respect to the length L of the vertical Hall device 1 (usually $d_{NW}/L \ll 1$). It can be shown by conformal mapping that the nominal size of the inner contacts 5 and 6 would be very small and below the limits of actual CMOS technologies.

(ii) A substantial depth $d^+$ of the $N^+$ contact regions compared to the small distance $1_2$ between the inner contacts 5 and 6. A consequence of this fact is that the resistance $R_2$ consists of a parallel connection of two resistances: $R_2'$, which represents the resistance for a current flowing between the side-walls of the two $N^+$ regions of the inner contacts 5 and 6 very near and parallel to the device surface; and a resistance $R_2''$, which represents the resistance for a current flowing between the two inner contacts 5 and 6 at a "normal" depth below the device surface. The resistance $R_2$ of the parallel connected resistances $R_2'$ and $R_2''$ is smaller than that of the "normal" $R_2''$, which makes the problem of the inequality of $R_2$ and $R_4$ still worse.

Similar problems exist also in a five-contact vertical Hall device implemented in a CMOS technology.

DESCRIPTION OF THE PRIOR ART

A vertical Hall device was first described in U.S. Pat. No. 4,782,375. This device has five contacts arranged along a line, the two outermost of them being short-circuited. When designed properly, the five-contact vertical Hall device may meet the requirements a), d), and e); but it is much more difficult to meet the requirements b) and c) with the known five-contact structures.

The four-contact vertical Hall device disclosed in U.S. Pat. No. 5,057,890 intrinsically meets the exchangeability requirement c). But when implemented by using IC technology, the four-contact vertical Hall device usually has a very big offset and a low voltage-related magnetic sensitivity; that is, the requirements a) and d) are not met.

In U.S. Pat. No. 7,872,322 it was proposed to reduce the offset of an integrated four-contact Hall device by connecting a resistor in parallel with the resistor $R_4$. It was not disclosed whether this measure helps or perturbs meeting the other requirements listed above.

SUMMARY OF THE INVENTION

The invention concerns a four-contact or five-contact vertical Hall device with the contacts arranged along a straight line on the surface of a deep N-well. The four-contact vertical Hall device has two inner contacts and two outer contacts. The contacts are formed of highly doped $N^+$ regions. The five-contact vertical Hall device additionally has a central contact placed between the two inner contacts. The two outer contacts of the five-contact vertical Hall device are short-circuited, e.g., by a metal line which directly connects the two outer contacts. For symmetry reasons, the two inner contacts have a same length and a same width and the two outer contacts have a same length and a same width. Both, the four-contact vertical Hall device and the five-contact vertical Hall device are symmetrical with respect to a first symmetry line and a central symmetry plane which extends orthogonally to the first symmetry line.

The object of the invention is to develop a vertical Hall device, which fulfills all the above requirements a) through e) and which can be fabricated by using the process of a commercially available silicon CMOS integrated circuit technology. The invention proposes a novel layout of integrated four- and five-contact vertical Hall-effect devices, which allows for equating the values of the resistances $R_1$, $R_2$, $R_3$, $R_4$ as well as for achieving high magnetic sensitivity of the Hall device without the need to add separate fabrication steps to an existing silicon CMOS technology. The invention proposes new designs for vertical Hall devices as follows which reduce the resistance $R_4$ and/or increase the resistance $R_2$ (The reference numbers refer to FIGS. 1 and 2):

a) Four-contact Vertical Hall Device

According to an embodiment, the effective width of the outer contacts is bigger than the effective width of the inner contacts. The resulting effective width of the vertical Hall device along its length is therefore non-uniform, smaller near the inner contacts and larger toward the outer contacts. This design reduces the resistance $R_4$ between the outer contacts.

According to another embodiment of the invention, a $P^+$ stripe is disposed between the inner contacts 5 and 6. The $P^+$ stripe does not touch the $N^+$ regions of the inner contacts. The $P^+$ stripe is a heavily doped $P^+$ area. Preferably, the length of the $P^+$ stripe is selected so that its distance to the inner contacts is smaller than the minimum distance allowed by the design rules of the used IC technology. This design increases the resistance $R_2$ between the inner contacts.

According to a further embodiment, the resistance $R_4$ is reduced according to the first embodiment by making the effective width of the outer contacts bigger than the effective width of the inner contacts and the resistance $R_2$ is increased according to the second embodiment by disposing a $P^+$ stripe between the inner contacts.

b) Five-contact Vertical Hall Device

According to an embodiment, the effective width of the outer contacts is bigger than the effective width of the inner contacts and the effective width of the central contact is the same as or, preferably, less than the effective width of the inner contacts. The resulting effective width of the vertical Hall device along its length is non-uniform, smaller near the central contact and larger toward the outer contacts. This design reduces the resistance $R_4$ between an outer contact and the inner contact that is farthest away from this outer contact.

According to another embodiment, a $P^+$ stripe is disposed between the central contact and each of its neighbouring inner contacts. The two $P^+$ stripes do not touch the $N^+$ areas of the neighbouring contacts. The length of the two $P^+$ stripes is preferably selected so that their distance to the neighbouring $N^+$ contacts is smaller than the minimum distance allowed by the design rules of the used IC technology. This design increases resistances between the inner contacts and the central contact.

The $P^+$ stripes of this embodiment may be also added to the vertical Hall device of the first embodiment.

The effective width of the inner contacts may be defined by the course of an inner edge of an additional deep P-well ring. The width of the opening of the deep P-well ring which is enclosed by the inner edge of the deep P-well ring is bigger at the outer contacts than as at the inner contacts. The deep P-well ring has a depth that is less than the depth of the deep N-well. Because the lateral diffusion of the deep P-well ring is smaller than the lateral diffusion of the deep N-well ring, the shape of the active zone contributing most to the magnetic sensitivity of the vertical Hall device is better defined.

The term "effective width" of a contact has the meaning that it is not the width of the contact at the surface of the N+ region that counts but the width of the area where the deep N-well and the highly doped $N^+$ region forming the contact merge into one another.

The design of all these embodiments allows equating the resistances $R_1$, $R_2$, $R_3$, $R_4$. Furthermore, these designs also improve the other characteristics of the four or five-contact vertical Hall device, particularly the voltage-related magnetic sensitivity.

The variable width of the vertical Hall device of the invention along its length is different from all known designs of prior art vertical Hall devices, where the width W is constant as illustrated in FIG. 2. The width W of the vertical Hall device corresponds to the thickness of a conventional horizontal Hall device. The horizontal Hall devices always have a uniform thickness of the active layer. Obviously, the uniformity of the width W of the vertical Hall devices has been considered a rule by analogy with the horizontal Hall devices. The invention breaks with this rule.

The variable width of the vertical Hall device of the invention along its length means that the active zone of the Hall device is significantly three-dimensional, whereas the active zone of the vertical Hall devices of the prior art is essentially two-dimensional (the active zone lies in the plane XZ of FIG. 3).

The shallow $P^+$ stripe (or stripes) eliminates some negative effects originating from the three-dimensional structure of the $N^+$ contacts, and makes them behave like two-dimensional contacts (which is in the plane XY of FIG. 3).

Therefore, the essence of the invention is the improvement of the characteristics of vertical Hall devices by A) transforming some parts of its active zone from a two dimensional structure into a three dimensional structure, and B) transforming some other parts of its active zone from a three dimensional structure into a two dimensional structure. The best results are achieved when the measures A) and B) are combined.

According to a first aspect, a vertical Hall device has a deep N-well, two inner contacts and two outer contacts disposed at a surface of the deep N-well and arranged along a straight symmetry line, wherein the two inner contacts have a same length and a same effective width and the two outer contacts have a same length and a same effective width, wherein the lengths are measured along the straight symmetry line and the widths are measured perpendicularly to the straight symmetry line, and wherein the contacts are arranged symmetrically with respect to a central symmetry plane, and wherein the effective width of the outer contacts is bigger than the effective width of the inner contacts.

The vertical Hall device may have a $P^+$ stripe is disposed between the inner contacts and wherein the $P^+$ stripe is separated from the inner contacts by a distance.

The vertical Hall device may further comprise a central contact disposed between the inner contacts.

The vertical Hall device may further comprise a $P^+$ stripe disposed between the central contact and the one of the inner contacts and a further $P^+$ stripe disposed between the central contact and the other of the inner contacts, wherein the two $P^+$ stripes are separated from the central contact and the respective neighbouring inner contact by a distance.

The vertical Hall device may further comprise a deep P-well ring, wherein an inner edge of the deep P-well ring defines the effective width of the inner contacts and, if applicable, the effective width of the central contact.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention. The figures are for clarity reasons not drawn to scale. In the drawings.

DETAILED DESCRIPTION OF THE INVENTION

Figure 4:
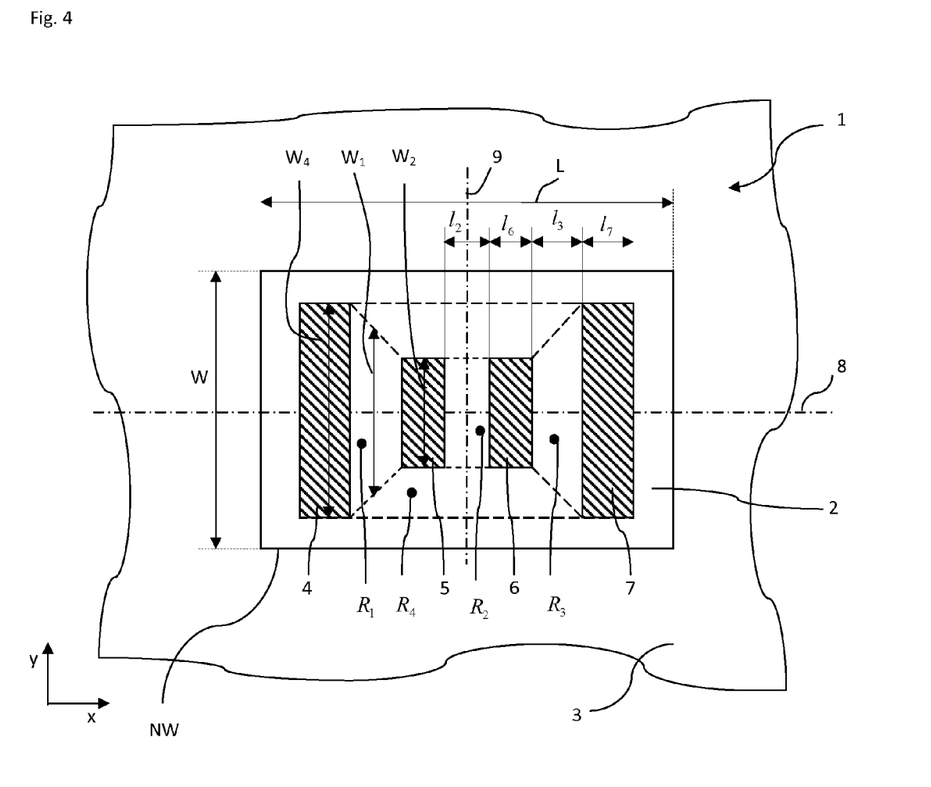
FIG. 4 shows a plan view of a first embodiment of a four-contact vertical Hall device according to the invention.

FIG. 4 shows a plan view of a first embodiment of a four-contact vertical Hall device 1 according to the invention. The vertical Hall device 1 is manufactured for example by the well-known CMOS technology and comprises a deep N-well NW embedded in a low-doped P-type substrate 3 (with substrate doping PS). The deep N-well NW has preferably a rectangular shape of length L and width W. The vertical Hall device 1 has four electrical contacts 4-7 disposed at the surface of the N-well NW and arranged along a first symmetry line 8 and symmetrically with respect to a symmetry plane 9. The symmetry line 8 is a straight line and runs orthogonally to the symmetry plane 9. The electrical contacts 4-7 are formed of highly doped $N^+$ regions which are contacted in conventional manner by metal lines (not shown). The electrical contacts 4-7 have approximately rectangular shapes. The inner contacts 5, 6 have a same length $l_6$ and a same width $w_2$ and the outer contacts 4, 5 have a same length $l_7$ and a same width $w_4$. Preferably, the length $l_6$ of the inner contacts 5, 6 is less than the length $l_7$ of the outer contacts 4, 5, namely:

$$l_6 < l_7 \qquad (1)$$

but the lengths $l_6$ and $l_7$ may also be the same $l_6 = l_7$.

The distance $l_2$ between the inner contacts 5 and 6 is preferably smaller than the distance $l_3$ between an inner contact and its neighbouring outer contact, namely:

$$l_2 < l_3 \qquad (2)$$

but the distances $l_2$ and $l_3$ may also be the same $l_2 = l_3$.

The preferred distances according to equations (1) and (2) are known from conformal mapping in the prior art and are not discussed here.

According to the invention, the width $w_2$ of the inner contacts 5 and 6 is smaller than the width $w_4$ of the outer contacts 4 and 5, namely:

$$w_2 < w_4 \quad (3)$$

In one embodiment, making use of a 0.35 μm CMOS technology, the widths were selected $w_4=2$ μm and $w_2=w_4/2=1$ μm.

With the width $w_4$ of the two outer contacts 4 and 7 being bigger than the width $w_2$ of the two inner contacts 5 and 6, the effective width of the vertical Hall device along its length is now highly non-uniform: in the vicinity of the inner contacts 5 and 6 the width of the vertical Hall device 1 is much smaller than the width of the vertical Hall device 1 in the vicinity of the outer contacts 4, 7. The influence of these facts on the values of the resistances $R_1$ to $R_4$ can be estimated by comparing the planar shapes of the resistances in FIGS. 1, 2 and 4: according to the prior art (FIGS. 1 and 2), all four resistances have—seen in plan view—equal widths; whereas according to the invention (FIG. 4), the effective widths of the resistances—seen in plan view—are very different. Although the regions of the resistances $R_1$ to $R_4$ in FIG. 4 are of three-dimensional nature, with complicated current distributions, they can be approximated by simple shapes: in plan view, the resistances $R_1$ and $R_3$ appear as trapezoides having a middle width $w_I$, and the resistances $R_2$ and $R_4$ appear as rectangles having widths $w_2$ and $w_4$, respectively, with $w_2<w_4$. Recall the problem of the prior art that $R_4>>R_2$, i.e., $R_4/R_2>>1$. If the length L and all the other lengths of the vertical Hall devices shown in FIGS. 1 and 4 are kept the same, the fact that now $w_2<w_4$ means that the ratio of the resistors $R_4/R_2$ is reduced, namely $$(R_4/R_2)(\text{invention}) < (R_4/R_2)(\text{prior art}) \quad (4)$$

This means that the invention effectively reduces the imbalance between the resistances $R_2$ and $R_4$ and considerably enhances the chance to meet the condition $R_4=R_2$.

The ratio of the widths $w_4$ and $w_2$ is at least $w_4/w_2>1.2$

A similar analysis results in the conclusion that the variable thickness also has a beneficial influence on the ratio of the resistances $R_1$ and $R_3$ with the resistances $R_2$ and $R_4$.

In a vertical Hall device, most of the useful magnetic-field-dependent electromotive force appears near the inner contacts 5 and 6 of the device. If the width $w_5$ of the inner contacts 5 and 6 of FIG. 4 is equal to the width W of FIG. 3, and if equal supply currents are fed to the input terminals, the Hall devices shown in FIGS. 1 and 4 have approximately equal voltages at their output terminals. But since the resistances $R_1$, $R_3$ and $R_4$ are smaller in the device of FIG. 4, the voltage-related magnetic sensitivity of the vertical Hall device according to the invention is higher than that of the prior art.

Figure 5:
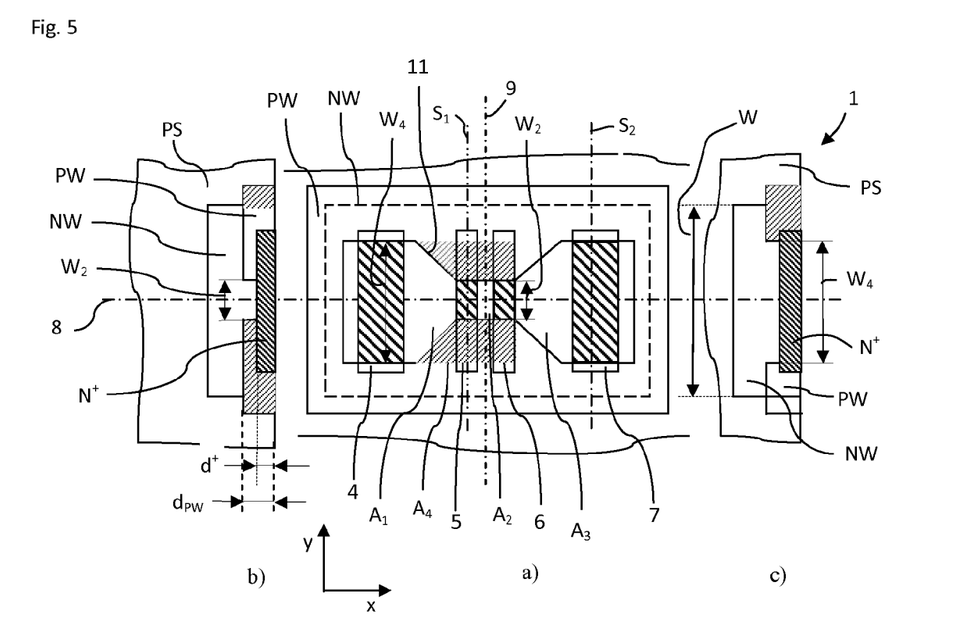
FIG. 5 shows a plan view and two cross-sections of a second embodiment of a four-contact vertical Hall device according to the invention.

FIG. 5 shows a plan view a) and two cross-sections b) and c) of a second embodiment of a four-contact vertical Hall device 1 according to the invention. The design of this vertical Hall device differs from the vertical Hall device 1 shown in FIG. 4 in that the effective width of the inner contacts 5 and 6 is defined by an additional appropriately shaped P-well ring PW and not by the nominal width of the N⁺ regions. The P-well ring PW is made of a moderately doped P-type area. The average doping of the N⁺ regions, deep P-well and deep N-well is chosen such that $$\text{Doping } N^+ >> \text{Doping } PW >> \text{Doping } NW \quad (5)$$

Therefore, when two or more of these layers overlap, the layer with the highest doping dominates. The plan view illustrated in FIG. 5 a) shows that
a) The nominal width $w_4$ of the inner contacts 5 and 6 is the same as the nominal width of the outer contacts 4 and 7.
b) The P-well ring PW has an inner shape that is narrower near the inner contacts 5 and 6 than near the outer contacts 4 and 7.

The result is that the width of the N⁺ regions at the surface of the N-well NW is equal for all N⁺ regions but that the width of the inner contacts 5 and 6 in the depth ranging from $d^+$ to $d_{PW}$ is smaller than the width of the outer contacts 4 and 7 in this depth range. This facilitates contacting the N⁺ regions with metal lines (not shown), which occurs at the surface of the device, but reduces the effective width of the inner contacts 5 and 6. The effective width of a contact is the width of the area where the N⁺ region contacts the deep N-well NW. The solid borderline of the contacts 4 to 7 in FIG. 5 a) illustrates the size of the contacts 4 to 7 at the surface of the chip while the hatched area inside the borderline illustrates the effective contact area at the depth $d_{PW}$ below the surface of the chip. The effective width is therefore smaller for the inner contacts 5 and 6 than for the outer contacts 4 and 7. This can be seen in FIG. 5 b) and 5 c) which show the cross sections of the vertical Hall device 1 along the lines $S_1$ and $S_2$ shown in FIG. 5 a), respectively. As illustrated in FIG. 5 b), the depths $d^+$ and $d_{PW}$ of the N⁺ regions and the deep P-well ring PW are chosen so that $$d^+ < d_{PW}. \quad (6)$$

The doping profiles shown in FIG. 5 b) and c) illustrate that the effective width $w_2$ of the contacts 5 and 6 is smaller than the effective width $w_4$ of the contacts 4 and 7.

In order to fulfil the equations (5) and (6), the shape of the inner edge 11 of the P-well ring PW is chosen so that P-well ring PW channels the current flowing between the input terminals into the areas denoted in FIG. 5 a) by $A_1$, $A_2$, $A_3$ and $A_4$. This is indicated by the facts that the width of the electrical contacts between the N⁺ regions of the inner contacts 5, 6 and of the adjacent part of the deep N-well NW are small—see $w_2$ in FIG. 5 b) and that the width of the contacts between the N⁺ regions of the outer contacts 4, 7 and of the adjacent part of the deep N-well NW are large—see $w_4$ in FIG. 5 c). Moreover, the width of the resistance $R_4$ is essentially given by the width w of the deep N-well NW, as indicated in FIG. 5 c). So in spite of the fact that the distance between the outer contacts 4 and 7 is larger than the distance between the inner contacts 5 and 6, since the widths of the conductive regions of the deep N-well NW between these pairs of contacts are also different with a convenient proportion, namely $w_4>w_2$, the resistances between these two pairs of contacts can be made similar, that is $R_4 \approx R_2$.

Therefore, the application of the additional deep P-well ring PW of the described shape helps achieving the equality of the resistances $R_1$, $R_2$, $R_3$ and $R_4$. Moreover, forcing the current between the inner contacts 5 and 6 into a channel of narrow width $w_2$ results in increasing the current-related sensitivity of the vertical Hall device 1.

Figure 6:
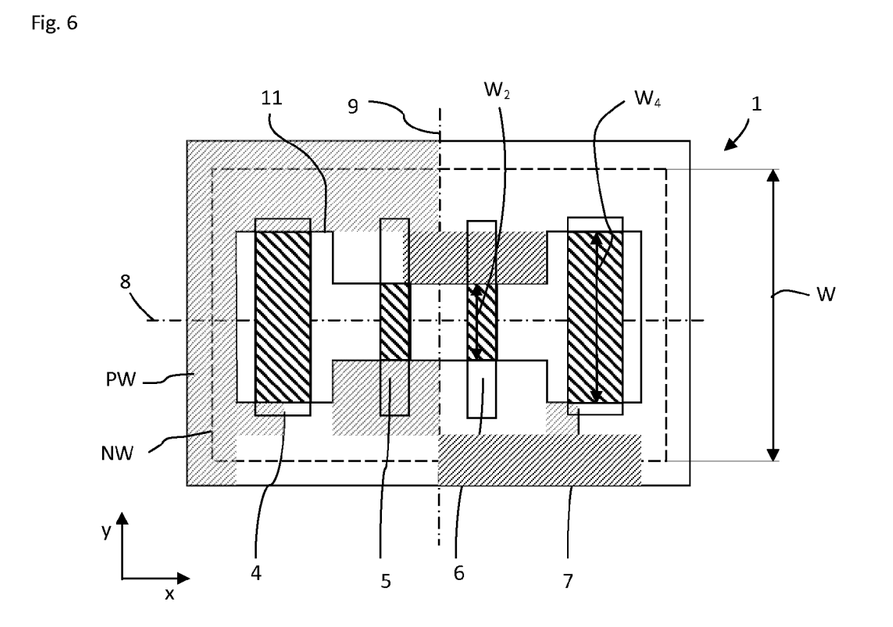
FIG. 6 shows a plan view of a third embodiment of a four-contact vertical Hall device according to the invention.

FIG. 6 shows a plan view of a third embodiment of a four-contact vertical Hall device according to the invention. The only difference with respect to the second embodiment shown in FIG. 5 a) is a different shape of the inner edge 11 of the deep P-well ring PW. But the essential features of the embodiments shown in FIGS. 5 and 6 are the same.

Figure 7:
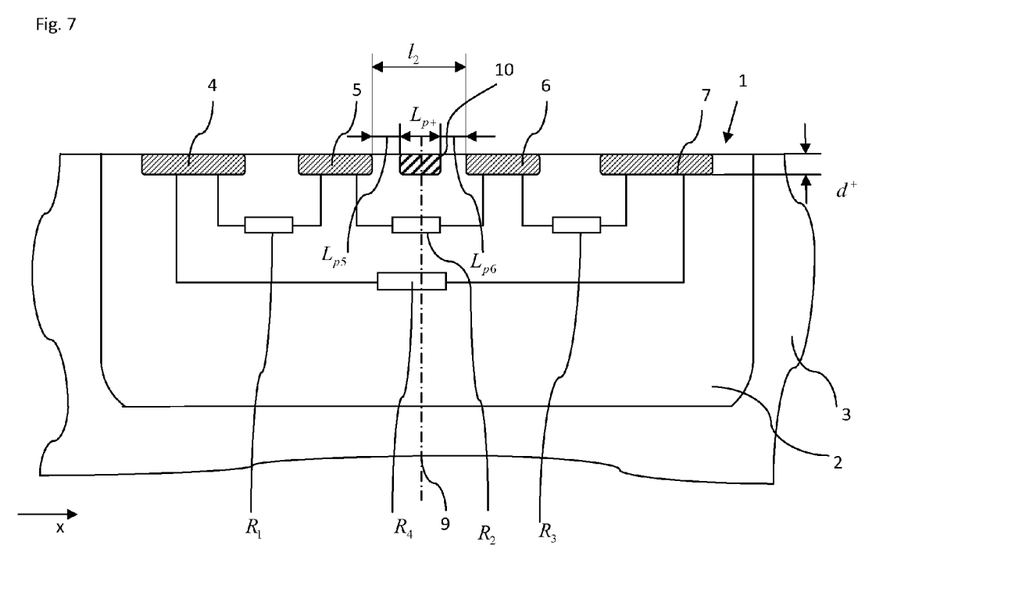
FIG. 7 shows a cross-section of a fourth embodiment of a four-contact vertical Hall device according to the invention.

FIG. 7 shows a cross-section of a fourth embodiment of a four-contact vertical Hall device 1 according to the invention. The vertical Hall device 1 has a P⁺ stripe 10 disposed between the N⁺ regions of the inner contacts 5 and 6. The P⁺ stripe 10 is implemented by using a shallow highly doped P-type layer having a depth approximately equal to the depth d⁺of the N⁺ layer. The P⁺ stripe 10 has a length $L_{P+}$ which is chosen such that the P⁺ stripe 10 does not touch the neighbouring contacts 5 or 6 and 12, i.e. the P⁺ stripe 10 and the inner neighbouring contacts 5 or 6 and 12 are separated by distances $L_{P5}$ and $L_{P6}$, respectively. The separation between the P⁺region of the P⁺ stripe 10 and the N⁺ regions of the neighbouring contacts 5 or 6 and 12 is needed in order to avoid a tunneling current between these regions. Since the P⁺ stripe 10 is surrounded by N-type material, it is isolated from it by a depletion layer. This depletion layer prohibits a lateral current to flow between the adjacent side walls of the N⁺ regions of the contacts 5 or 6 and 12. In other words, the conduction path indicated by the resistance $R_2'$ in FIG. 2 is eliminated. By doing so, the resulting resistance $R_b$ between the inner contact 5 or 6 and the central contacts 12 increases and it becomes easier to equate the resistances $R_a$ and $R_b$. Since such a lateral current between the adjacent side walls of the N⁺ regions of the contacts 5 or 6 and 12 would not add to but diminish the Hall voltage, the addition of the P⁺ stripe 10 is also beneficial for achieving a higher magnetic sensitivity of the Hall device 1. Optionally, a deep P-well PW shaped as shown in FIGS. 5 and 6 may be used to define the width of the active zone and also the width of the contacts 5 and 6 or of all contacts 4 to 7.

A well designed four-contact integrated vertical Hall device should have a very small distance $l_2$ between the inner contacts 5 and 6. This requirement makes impossible the realization of the P⁺ region 10 and the gaps $L_{P5}$ and $L_{P6}$ while respecting the design rules of a given CMOS technology. For example, in a 0.35 μm CMOS technology, the design rules allow about 0.5 μm for each of the distances $L_{P+}$, $L_{P5}$ and $L_{P6}$, that is $L_{P+}+L_{P5}+L_{P6}>1.5$ μm, whereas the conformal mapping suggests that it should be $l_2=L_{P+}+L_5+L_{P6}=0.5$ μm. However, the design rules for an IC technology were created to insure the proper functioning of the MOSFET transistors, not the proper functioning of separation stripes in Hall devices, which is a much simpler and less demanding requirement. Experimental results of the inventors have shown that a vertical Hall device 1 with $L_{P+}=0.2$ μm and $L_5=L_{P6}=0.15$ μm functions perfectly and can be manufactured with good yield.

Alternatively, instead of using the deep P-well ring PW, the deep N-well NW can be a ring that is shaped like the deep P-well ring PW.

Figure 8:
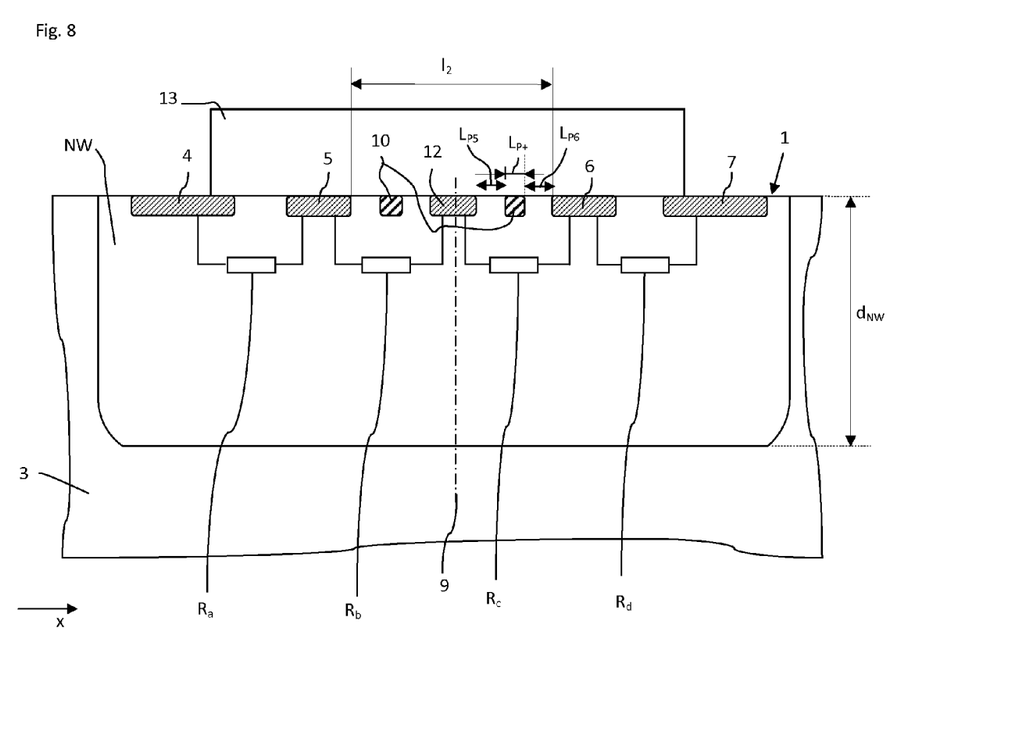
FIG. 8 shows a cross-section of an embodiment of a five-contact vertical Hall device.

Principally, five-contact vertical Hall elements can be designed straightforward in an analogous way in order to reduce the respective resistances $R_a$, $R_d$; and/or to increase the resistances $R_b$ and $R_c$ see FIG. 8 for these resistances.

FIG. 8 shows a cross-section of a five-contact vertical Hall device 1. The five-contact vertical Hall device 1 has a deep N-well NW, two inner contacts 5, 6 and two outer contacts 4, 7 and a central contact 12 disposed between the inner contacts 5 and 6. The contacts 4 to 7 and 12 are disposed at a surface of the deep N-well NW and arranged along a straight symmetry line. The two inner contacts 5 and 6 have a same length and a same width and the two outer contacts 4 and 7 have a same length and a same width. The inner contacts 5 and 6 and the outer contacts 4 and 7 are disposed symmetrically with respect to the central contact 12. The two outer contacts 4 and 7 are short-circuited, e.g. by connecting them directly through a metal line 13 (shown symbolically). The metal line 13 serves then as one of the terminals of the Hall device as it short circuits the contacts 4 and 7. In normal operation of the vertical Hall device 1, either the contact 12 and the metal line 13 are used as input terminals and the contacts 5 and 6 as output terminals, or the contacts 5 and 6 are used as input terminals and the contact 12 and the metal line 13 as output terminals. The resistances Ra, Rb, Rc and Rd symbolize the electrical resistances between the said terminals of the device. The electrical equivalent circuit of the five-contact vertical Hall device 1 is a Wheatstone bridge formed by the resistances $R_a$, $R_b$, $R_c$ and $R_d$, similar as that shown in FIG. 3. For symmetry reasons it is $R_a=R_d$ and $R_b=R_c$.

FIG. 8 illustrates an embodiment of the five-contact vertical Hall device 1 according to the invention wherein a P⁺ stripe 10 is disposed between each of the inner contacts 5 and 6 and the central contact 12. The P⁺ stripes 10 are separated from the respective neighbouring inner contact 5, 6 and the central contact 12 by a distance. The P⁺ stripes 10 increase the resistance $R_b$ between the contacts 5 and 12, and the resistance $R_c$ between the contacts 12 and 6, while keeping a small distance $l_2$, as determined by conformal mapping. Optionally, a deep P-well PW may be used to define the width of the active zone and also the width of the contacts 5, 6 and 12 or 4 to 7 and 12.

Figure 9:
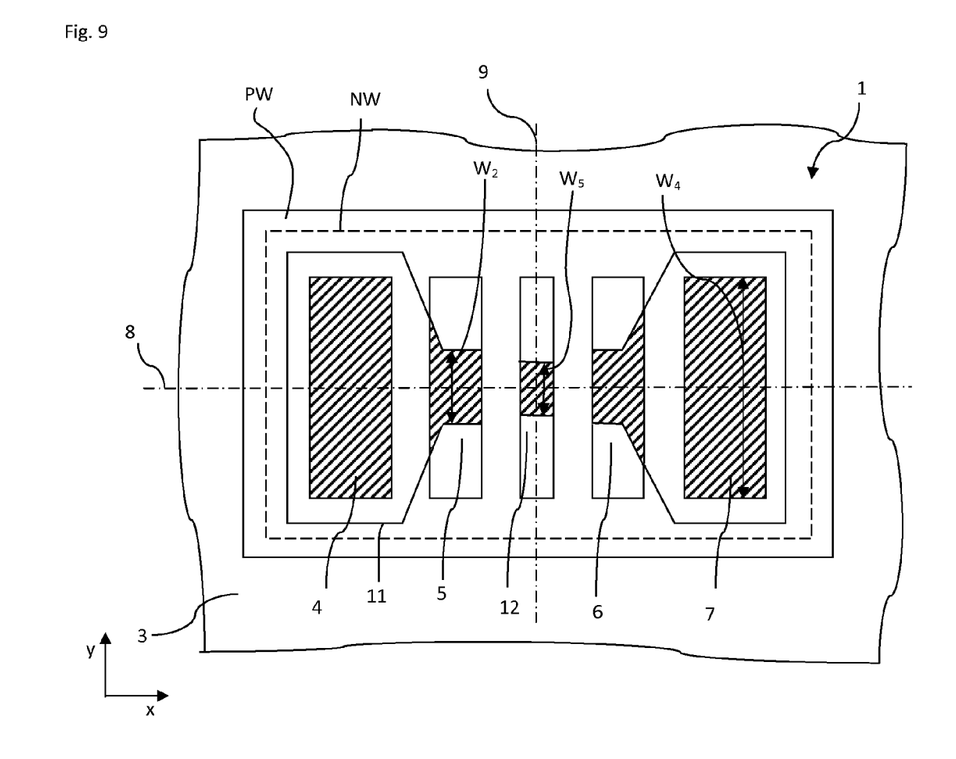
FIG. 9 shows a plan view of another embodiment of a five-contact vertical Hall device according to the invention.

In another embodiment of a five-contact vertical Hall device according to the invention, the effective width $w_4$ of the outer contacts 4, 7 is bigger than the effective width of the inner contacts 5, 6 which is slightly larger than $w_2$. This can be achieved by making the width of the N⁺ regions of the inner contacts 5 and 6 and the central contact 12 smaller than the width of the N⁺ regions of the outer contacts 4 and 7 analogously to the embodiment of the four-contact vertical Hall device 1 shown in FIG. 4, or, as shown in FIG. 9, by adding a deep P-well ring PW wherein the inner edge 11 of the deep P-well ring PW is appropriately shaped. In the embodiment shown in FIG. 9, the effective width $w_5$ of the central contact 12 is smaller than the effective width of the inner contacts 5 and 6 which is slightly larger than $w_2$, but the width of the central contract 12 may also be the same as the effective width of the inner contacts 5 and 6.

Optionally, the P⁺ stripes 10 shown in FIG. 8 may also be added to the vertical Hall device 1 shown in FIG. 9.

In an embodiment, the vertical Hall devices 1 are fabricated using a 0.35 μm "high voltage CMOS technology" which provides the following doping layers:

for the deep N-well NW: Deep N-well layer, with a depth of about 5 μm, for the deep P-well ring PW: Deep P-well PW layer, with a depth of about 2 μm, for the N⁺ regions: N⁺ layer used for drain and source of the NMOS transistors, with a depth of about 0.2 μm, for the P⁺ regions: P⁺layer used for drain and source of the PMOS transistors, with a depth of about 0.2 μm.

What is claimed is:

1. A vertical Hall device including a deep N-well, a first outer contact, a first inner contact, a second inner contact and a second outer contact disposed at a surface of the deep N-well and arranged in this order along a straight symmetry line and symmetrically with respect to a central symmetry plane, wherein the two inner contacts and the two outer contacts are configured to operate either with the first outer contact and the second inner contact used to supply a current and the first inner contact and the second outer contact used to tap a Hall voltage or the first inner contact and the second outer contact used to supply a current and the first outer contact and the second inner contact used to tap the Hall voltage, the two inner contacts have a same length and a same effective width and the two outer contacts have a same length and a same effective width, wherein the lengths are measured along the straight symmetry line and the widths are measured perpendicularly to the straight symmetry line, and the effective width of the outer contacts is bigger than the effective width of the inner contacts.

2. The vertical Hall device according to claim 1, wherein a $P^+$ stripe is disposed between the inner contacts and wherein the $P^+$ stripe is separated from the inner contacts by a distance.

3. The vertical Hall device according to claim 1, further comprising a deep P-well ring, wherein an inner edge of the deep P-well ring defines the effective width of the inner contacts and, if applicable, the effective width of the central contact.

4. The vertical Hall device according to claim 2, further comprising a deep P-well ring, wherein an inner edge of the deep P-well ring defines the effective width of the inner contacts and, if applicable, the effective width of the central contact.

5. A vertical Hall device including a deep N-well, a first outer contact, a first inner contact, a central contact, a second inner contact and a second outer contact disposed at a surface of the deep N-well and arranged in this order along a straight symmetry line and symmetrically with respect to a central symmetry plane, wherein the first outer contact and the second outer contact are coupled together to form short-circuited outer contacts, the two inner contacts, the two outer contacts and the central contact are configured to operate either with the short-circuited outer contacts and the central contact used to supply a current and the first inner contact and the second inner contact used to tap a Hall voltage, or the first inner contact and the second inner contact used to supply a current and the short-circuited outer contacts and the central contact used to tap the Hall voltage, the two inner contacts have a same length and a same effective width and the two outer contacts have a same length and a same effective width, wherein the lengths are measured along the straight symmetry line and the widths are measured perpendicularly to the straight symmetry line, and the effective width of the outer contacts is bigger than the effective width of the inner contacts.

6. The vertical Hall device according to claim 5, further comprising a $P^+$ stripe disposed between the central contact and the one of the inner contacts and a further $P^+$ stripe disposed between the central contact and the other of the inner contacts, wherein the two $P^+$ stripes are separated from the central contact and the respective neighbouring inner contact by a distance.

7. The vertical Hall device according to claim 5, further comprising a deep P-well ring, wherein an inner edge of the deep P-well ring defines the effective width of the inner contacts and, if applicable, the effective width of the central contact.

8. The vertical Hall device according to claim 4, further comprising a deep P-well ring, wherein an inner edge of the deep P-well ring defines the effective width of the inner contacts and, if applicable, the effective width of the central contact.

* * * * *